(12) United States Patent
Titus et al.

(10) Patent No.: US 6,496,528 B2
(45) Date of Patent: Dec. 17, 2002

(54) LINE NARROWING UNIT WITH FLEXURAL GRATING MOUNT

(75) Inventors: Clay C. Titus, San Diego, CA (US); William G. Hulburd, San Diego, CA (US); Raymond F. Cybulski, San Diego, CA (US); John M. Algots, San Diego, CA (US); Michael S. Lysik, Yorba Linda, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/895,664

(22) Filed: Jun. 29, 2001

(65) Prior Publication Data

US 2002/0034208 A1 Mar. 21, 2002

Related U.S. Application Data

(63) Continuation-in-part of application No. 09/451,407, filed on Nov. 30, 1999, which is a continuation-in-part of application No. 09/390,579, filed on Sep. 3, 1999, now Pat. No. 6,212,217.

(51) Int. Cl.⁷ .............................. H01S 3/08; H01S 3/10

(52) U.S. Cl. ........................ 372/102; 372/20; 372/57; 372/99; 385/37

(58) Field of Search ....................... 372/102, 20, 32, 372/99, 100, 107, 108, 57, 58, 97; 385/37

(56) References Cited

U.S. PATENT DOCUMENTS

| | | | |
|---|---|---|---|
| 3,845,409 A | 10/1974 | Wada et al. | 331/94.5 |
| 4,977,563 A | 12/1990 | Nakatami et al. | 372/32 |

(List continued on next page.)

FOREIGN PATENT DOCUMENTS

| | | |
|---|---|---|
| JP | 04314374 | 4/1991 |
| JP | 2696285 | 12/1991 |

(List continued on next page.)

OTHER PUBLICATIONS

Alvarez, et al., "Exposure of Inert Gas Purifers to Air," *Journal of the IEST*: 41(6):26–33, (1998).

(List continued on next page.)

Primary Examiner—Hemang Sanghavi
(74) Attorney, Agent, or Firm—John R. Ross

(57) ABSTRACT

A grating based line narrowing device for line narrowing lasers producing high energy laser beams. Techniques are provided for minimizing adverse effects of heat produced by the laser beam inside the line narrowing device.

A flexural grating mount is provided which virtually eliminates stress on the grating caused by differential thermal expansion between the grating and the LNP housing structure. In a preferred embodiment the grating which is comprised of a very thin lined aluminum surface on a thick ultra low expansion glass substrate is attached to an aluminum housing structure using a flexural grating mount. At least one flexure joint is provided in the grating mount which permits thermal expansion and contraction of the aluminum housing without producing undesirable mechanical stresses in the glass substrate of the grating. In some embodiments the mount comprises a metal plate and the flexure joint is a H-Flex joint which is machined into the metal plate. In another embodiment two H-Flex joints are provided. In other embodiments, the flexure joint is a dovetail joint permitting one end of the mount to slip relative to the other.

In another preferred embodiments a stream of gas is directed across the face of the grating. In other embodiments the effect of a hot gas layer on the face of the grating is reduced with the use of helium as a purge gas and in other embodiments the purge gas pressure is reduced to reduce the optical effects of the hot gas layer.

17 Claims, 14 Drawing Sheets

U.S. PATENT DOCUMENTS

| | | | |
|---|---|---|---|
| 5,095,492 A | | 3/1992 | Sandstrom .................. 372/102 |
| 6,147,341 A | * | 11/2000 | Lemaire et al. ................ 385/37 |
| 6,212,217 B1 | | 4/2001 | Erie et al. .................... 372/102 |
| 6,295,399 B1 | * | 9/2001 | Engelberth ................... 385/37 |

FOREIGN PATENT DOCUMENTS

| | | |
|---|---|---|
| JP | 05167172 | 12/1991 |
| JP | 2631607 | 10/1992 |

OTHER PUBLICATIONS

Press, et al., "Numerical Recipes, The art of Scientific Computing," Cambridge University Press, pp. 274–277, 289–293 and 312–321, (1990).

Ridgeway, et al., "Use of Atmspheric Pressure Ionization Mass Spectrometry for Evaluating Point–of–Use Perifiers: Intercomparison of Resin Based and Getter Type Purifiers Under Challenge Conditions,".

* cited by examiner

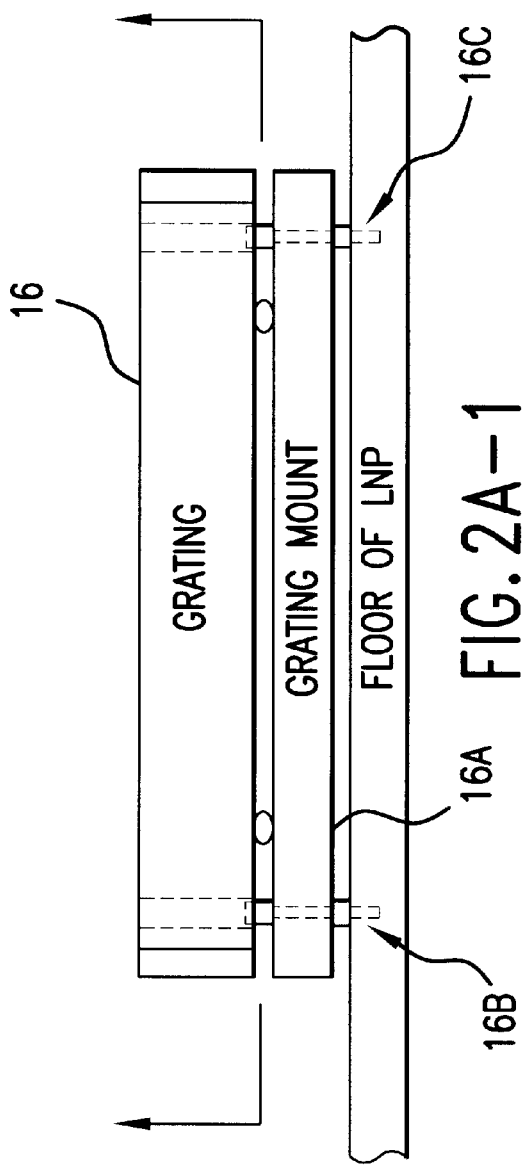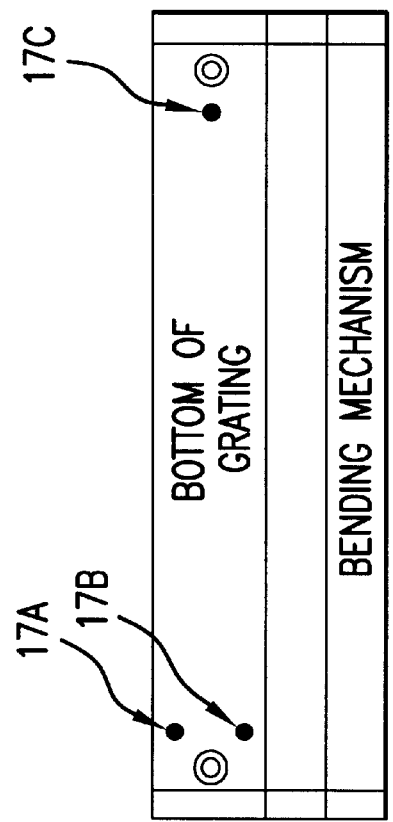

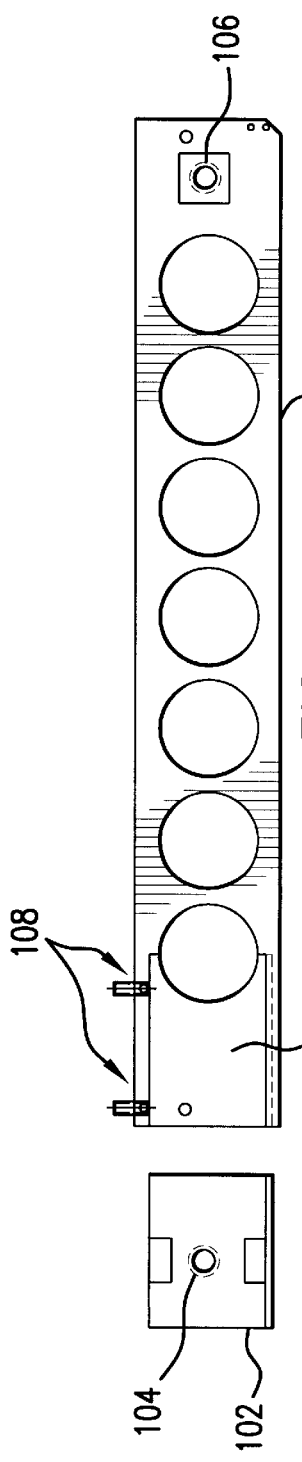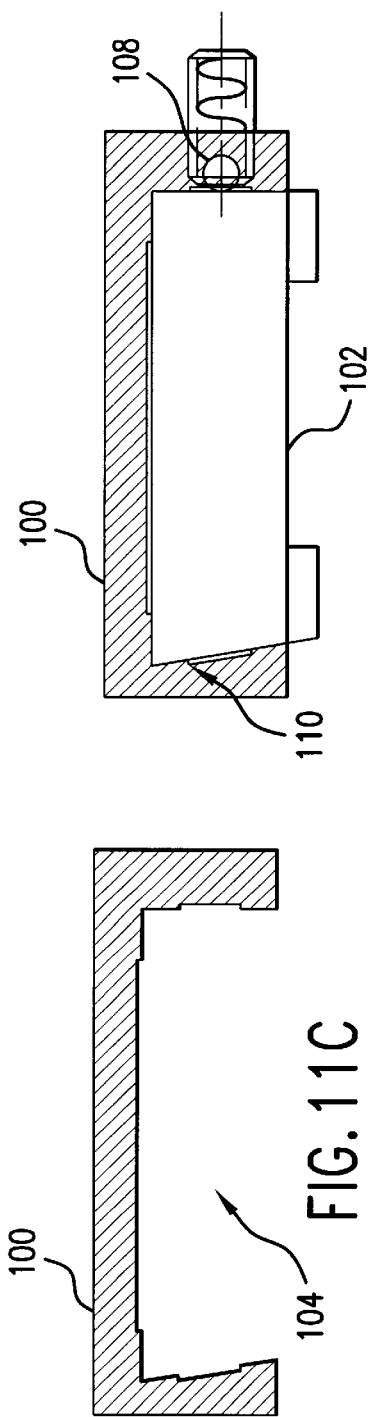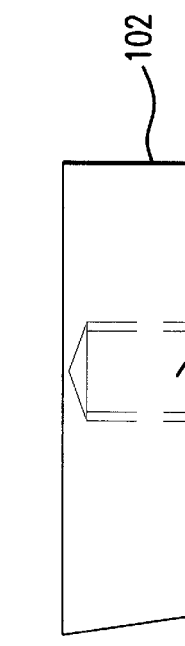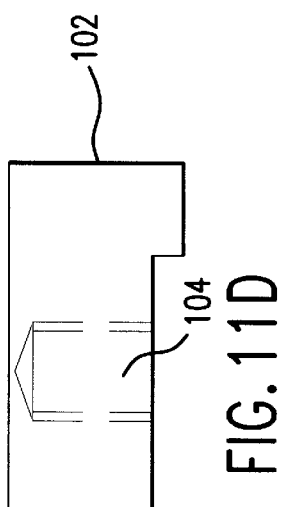
FIG. 11A
FIG. 11B
FIG. 11C
FIG. 11D
FIG. 11E

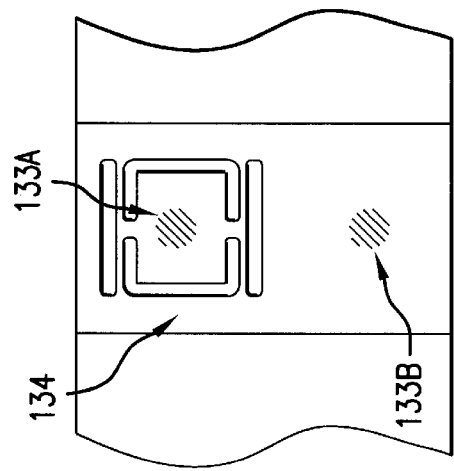
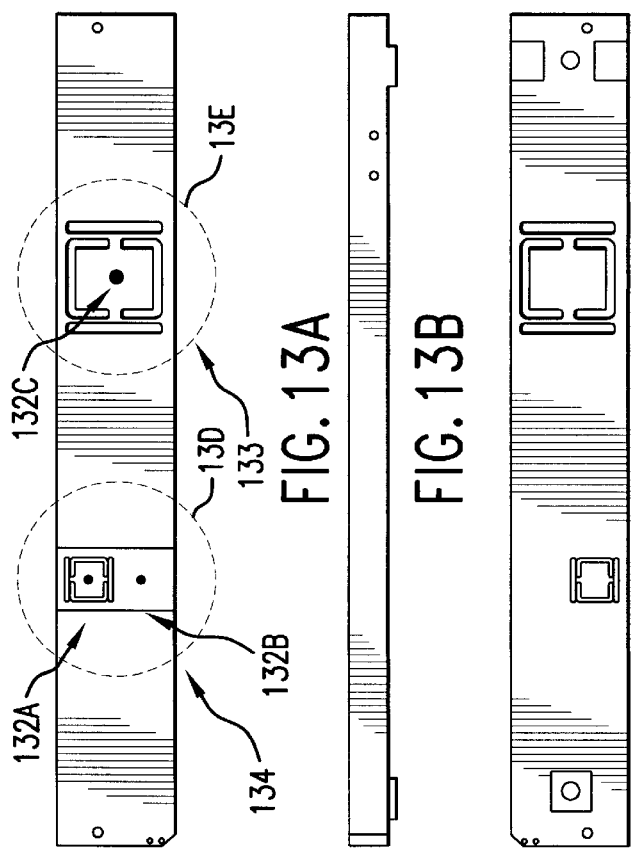

LINE NARROWING UNIT WITH FLEXURAL GRATING MOUNT

This invention relates to lasers and in particular to high power gas discharge lasers with a grating based line narrowing unit. This invention is a continuation-in-part of Ser. No. 09/451,407, filed Nov. 30, 1999 which was a continuation-in-part of Ser. No. 09/390,579, filed Sep. 3, 1999, now U.S. Pat. No. 6,212,217B1.

BACKGROUND OF THE INVENTION

Narrow Band Gas Discharge Lasers

Gas discharge ultraviolet lasers used as light sources for integrated circuit lithography typically are line narrowed. A preferred prior art line narrowing technique is to use a grating based line narrowing unit along with an output coupler to form the laser resonance cavity. The gain medium within this cavity is produced by electrical discharges into a circulating laser gas such as krypton, fluorine and neon (for a KrF laser); argon, fluorine and neon (for an ArF laser); or fluorine and helium and/or neon (for an $F_2$ laser).

Line Narrowing Packages

A sketch of such a prior art system is shown in FIG. 1 which is extracted from Japan Patent No. 2,696,285. The system shown includes output coupler (or front mirror) 4, laser chamber 3, chamber windows 11, and a grating based line narrowing unit 7. The line narrowing unit 7 is typically provided on a lithography laser system as an easily replaceable unit and is sometimes called a "line narrowing package" or "LNP" for short. This prior art unit includes two beam expanding prisms 27 and 29 and a grating 16 disposed in a Litrow configuration. Gratings used in these systems are extremely sensitive optical devices. A typical grating surface may have 10,000 grooves per inch created in an aluminum layer or layers on a thick glass substrate. These gratings and techniques for fabricating them are described in U.S. Pat. No. 5,999,318 which is incorporated herein by reference. A prior art technique for avoiding distortion of the grating surface is to mount the grating on a metal grating mount made of a material having a small co-efficient of thermal expansion closely matched to the thermal expansion co-efficient of the grating glass substrate. The gratings deteriorate rapidly under ultraviolet radiation in the presence of oxygen in standard air. For this reason, the optical components of line narrowing units for lithography lasers are typically purged continuously during operation with nitrogen.

FIG. 2 is a sketch showing a prior art line narrowing unit fabricated by Applicants' employer, Cymer, Inc., as a part of a prior art line narrowed lithography KrF laser system incorporating such a device. The unit includes three beam expanding prisms 8, 10 and 12, a tuning mirror 14 and a grating 16. Note that the nitrogen purge from bottle 44 enters the unit on the back side of the tuning mirror 46 to avoid purge flow directly on the grating face. In this system the wavelength of the laser beam 6 is controlled in a feedback arrangement in which the wavelength of the beam is measured by monitor 22 and computer controller 24 uses the wavelength information to adjust the angular position of tuning mirror 14 to control the wavelength to a desired value. The bandwidth control device 20 is used to mechanically bend grating 16 to make it slightly concave, for example. This device is described in detail in U.S. Pat. No. 5,095,492 assigned to Cymer. Use of this device permits reduction of the bandwidth somewhat, but it still goes out of specification when the laser is run at high duty cycle.

For many years, designers for line narrowed lasers have believed that distortions of the laser beam could be caused by gas flow near the face of the grating. Therefore, laser designers in the past have made special efforts to keep the purge nitrogen from flowing directly on the face of the grating. Several examples of these efforts are described in the Japan Patent 2,696,285 referred to above. In the example shown in extracted FIG. 1, the purge flow is directed from $N_2$ gas bottle 44 toward the back side of grating 16 through port 46.

Increased Repetition Rates

Line narrowed ultraviolet laser light sources currently in use in the integrated circuit industry typically produce about 10 mJ per pulse at repetition rates of about 1000 Hz and duty factors of about 20 percent. Increased integrated circuit production can be achieved at higher repetition rates and greater duty cycles. Applicants' employer is currently selling a 2000 Hz gas discharge lithography laser and Applicants and their fellow workers have designed a 4000 Hz gas discharge lithography laser. Applicants have experienced difficulties maintaining consistent narrow bandwidths at these higher repetition rates and duty cycles.

A need exists for reliable line narrowing devices and techniques for high repetition rate, high duty cycle gas discharge lasers.

SUMMARY OF THE INVENTION

The present invention provides a grating based line narrowing device for line narrowing lasers producing high energy laser beams. Techniques are provided for minimizing adverse effects of heat produced by the laser beam inside the line narrowing device.

A flexural grating mount is provided which virtually eliminates stress on the grating caused by differential thermal expansion between the grating and the LNP housing structure. In a preferred embodiment the grating which is comprised of a very thin lined aluminum surface on a thick ultra low expansion glass substrate is attached to an aluminum housing structure using a flexural grating mount. At least one flexure joint is provided in the grating mount which permits thermal expansion and contraction of the aluminum housing without producing undesirable mechanical stresses in the glass substrate of the grating. In some embodiments the mount comprises a metal plate and the flexure joint is a H-Flex joint which is machined into the metal plate. In another embodiment, two H-Flex joints are provided. In other embodiments, the flexure joint is a dovetail joint permitting one end of the mount to slip relative to the other.

In another preferred embodiments a stream of gas is directed across the face of the grating. In other embodiments the effect of a hot gas layer on the face of the grating is reduced with the use of helium as a purge gas and in other embodiments the purge gas pressure is reduced to reduce the optical effects of the hot gas layer.

BRIEF DESCRIPTION OF THE DRAWINGS

FIGS. 2A1 and 2A2 show a prior art grating mounting technique.

FIGS. 11A, B, C, and D, and E show features of a preferred embodiment of the present invention.

FIGS. 13A, B, C, D, and E show features of another preferred embodiment of the present invention.

DETAILED DESCRIPTION OF PREFERRED EMBODIMENTS

Figure 1:
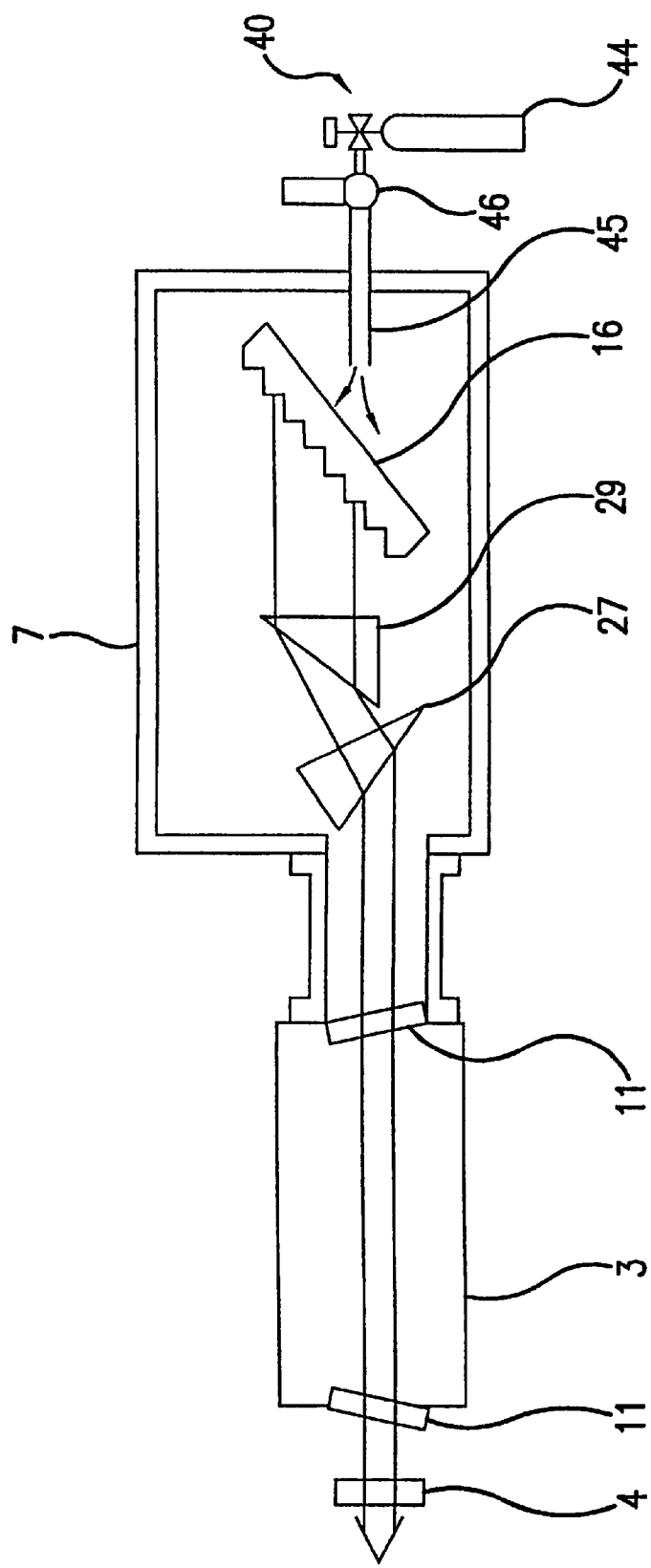
FIG. 1 shows a first prior art line narrowed laser system.

Preferred embodiments of the present invention can be described by reference to the figures.

Laser Performance at High Average Power

A prior art line narrowed KrF excimer laser operating at relatively low average power, typically less than 5 W will produce a laser beam centered at about 248 nm with a bandwidth of less than 0.6 pm. The laser can run without problems at high rep rate, up to 2000 Hz and even above that as long as average power is below 5 W. A typical lithography KrF excimer laser has a pulse energy of 10 mJ. Therefore, in order to avoid increases in average power, the laser has to be operated with a relatively low duty cycle. For example, it can be run at 2 kHz in bursts of 200 pulses with pause between bursts of about 0.45 second. Such an operation will produce an average power of:

$$P_{ave} = \frac{10 \text{ mJ} \cdot 200 \text{ pulses}}{0.5 \text{ sec}} = 4 \text{ W} \quad (1)$$

Problems with bandwidth control start to appear when the average power is increased. This happens, for example, when the interburst delay is decreased. For example, laser running the same 200 pulse bursts with 0.1 second interburst delay will have an average power of:

$$P_{ave} = \frac{10 \text{ mJ} \cdot 200 \text{ pulses}}{0.2 \text{ sec}} = 10 \text{ W} \quad (2)$$

At maximum, the laser is run in continuous mode which, at 2000 Hz and 10 mJ pulse energy, is equivalent to 20 W average power.

When the prior art laser system is run with high average power, the bandwidth increases gradually over a period of about 5 to 20 minutes from initial bandwidth of less than 0.6 pm, and remains substantially higher than 0.6 pm. Such an increase in bandwidth should be avoided in microlithography production runs, because it will cause images to blur due to chromatic alterations of projection lenses. Another important application is when the laser is used to test thermal properties at high duty cycles of other lithography components, such as the projection lens itself. In this application, the laser is supposed to maintain its bandwidth and other parameters within the specification during the duration of the test.

4000 Hz Laser

Lithography laser systems currently being tested for use in production include lasers designed to operate at 4000 Hz. Maintaining desired laser beam quality at these increased repetition rates is a challenge. Thermal effects are increased substantially as compared to the 2000 Hz systems.

Grating Distortion

Figure 2:
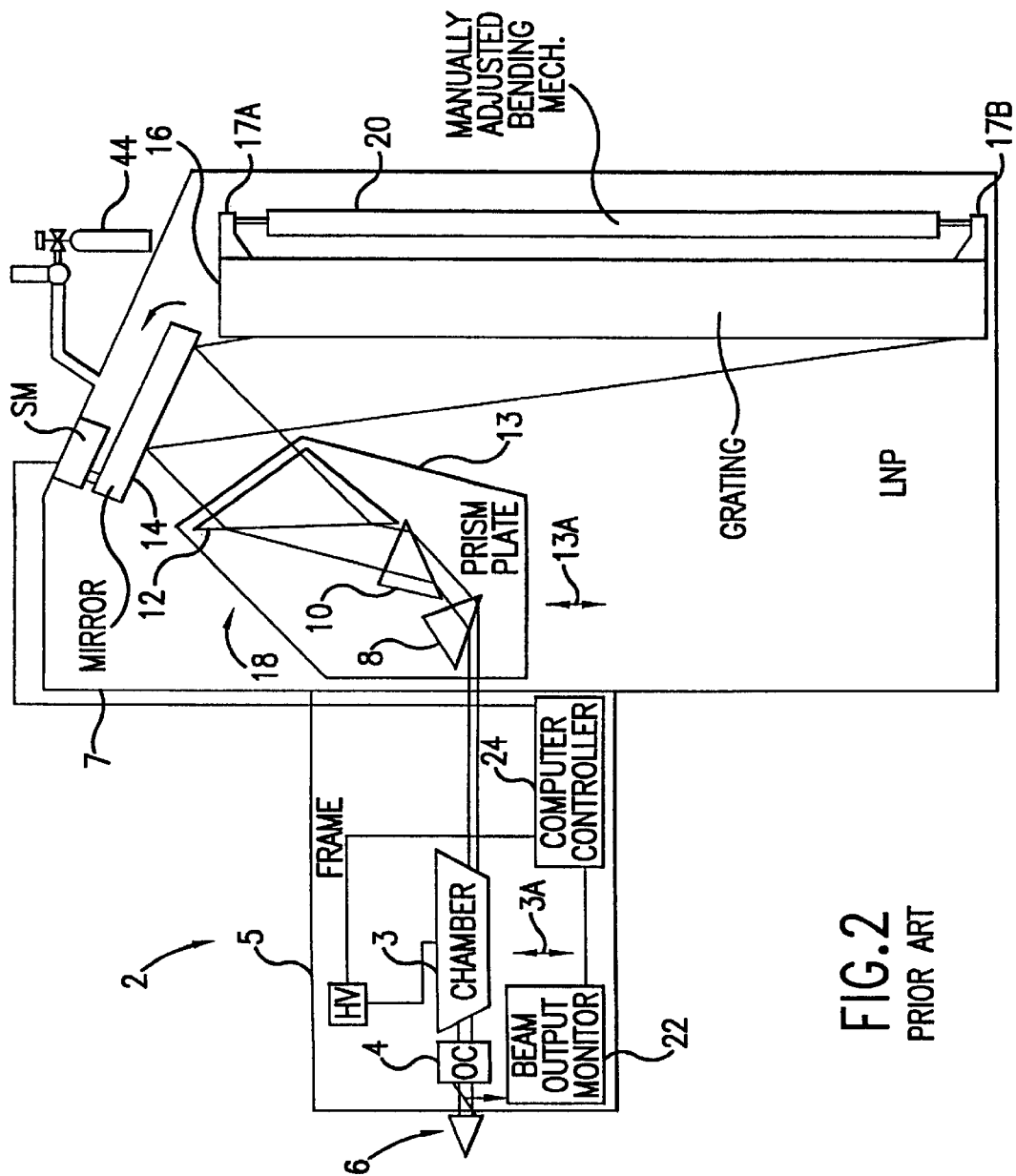
FIG. 2 shows a second prior art line narrowed laser system.

FIG. 2A1 is a side view showing a prior art method of mounting grating 16 to the floor of the LNP enclosure. In this case, the thick glass substrate of the grating is attached to mounting plate 16A at each of three spots with very short epoxy pillars. FIG. 2A2 shows the approximate pillar horizontal positions at 17A, 17B and 17C. The mounting plate is screwed securely to the floor of the LNP enclosure with two screws 16B and 16C. In this prior art design, the mounting plate is made of invar which has a co-efficient of thermal expansion close to zero and to that of the grating glass substrate which ultra low expansion glass and is also close to zero. However, the chamber enclosure is aluminum which has a co-efficient of thermal expansion substantially different from both invar and the grating glass substrate. As a consequence, temperature excursions in the LNP produces bending stresses on the mounting plate which is screwed tightly to the bottom of the LNP enclosure and the plate in turn produces bending stresses on the grating through the short epoxy pillars. As long as the temperature excursions are small the pillars are flexible enough to prevent significant distortion; however, at high repetition rates in the range of 2000 Hz to 4000 Hz and high duty factors, thermal distortion in the grating has been so great as to substantially adversely affect the quality of the laser beam both in terms of bandwidth and wavelength centerline stability.

Finding the Source of the Problem

When Applicants first began seeing beam quality deterioration with increasing beam energy, the cause was not apparent and many potential causes were investigated surface heating of the purge gas on the face of the grating was one cause and it was largely corrected by directing a flow of purge gas directly on the grating face as described in a following section. However, this did not completely eliminate the problem.

Finally, one of the Applicants loosened screw 16C as shown in FIG. 2A and the beam quality improved substantially. Applicants then recognized that differential thermal expansion was causing an undesirable bending of the grating which was causing the deterioration in beam quality. As a result, Applicants have designed several modifications in the LNP to solve this problem.

Dove Tail Design

One solution to the problem is shown in FIGS. 11A, B, C, D and E. FIGS. 11A and 11B are bottom views of a grating mount for minimizing thermal stress on the grating. This mount is comprised of two main parts 100 and 102. Part 102 slips into a dovetail slot 104 in part 100. Part 102 is bolted to the floor of the LNP with threaded hole 106 and part 100 is bolted to the floor of the LNP with threaded hole 104. FIG.

11C shows the dovetail slot in part 100 and FIG. 11D is an end view of part 102 showing how it is designed for a tight sliding fit in the slot. FIG. 11E shows part 102 positioned inside slot 104 in part 100. Two spring tensioned rollers 108 compress part 102 against side 110 of slot 104. The grating (not shown) is preferably mounted on top of part 100 using three short epoxy pillars about 1 cm in diameter and 4 mils high. This design permits the LNP floor to expand and contract without putting mechanical stress on the grating.

H-Flex Joint

Figure 12A:
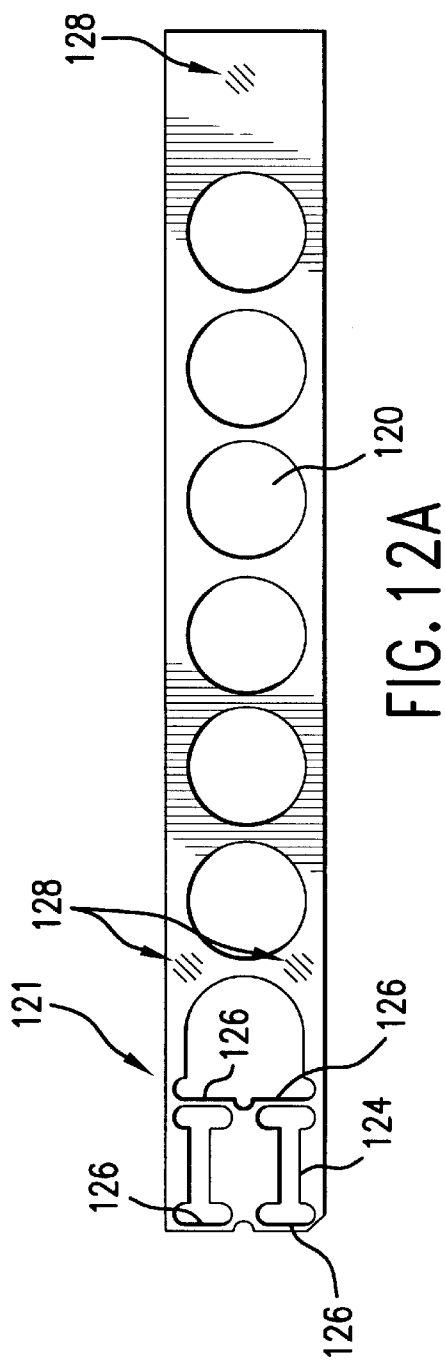
FIGS. 12A, B and C show features of another preferred embodiment of the present invention.

A second embodiment of the present invention can be described by reference to FIGS. 12A, B and C which are top, side and bottom views respectively of a grating mount with a single H-Flex joint. This mount is comprised of invar which, as stated above has a very small thermal co-efficient of expansion about the same as the fused silicon grating glass substrate. The mount is about ½ inch thick and has a length approximately equal to the thick glass substrate of the grating to be mounted on it. Holes 120 are cut into the mount primarily to reduce its weight. An H-Flex joint 121 is machined into the mount as shown in FIG. 12A. Two dogbone shaped holes 124 are cut into the mount producing an "H" shape flex joint so as to leave four flex legs 126 each about 0.060 inch thick. The grating is preferably mounted to the mount with three short epoxy pillars at locations 128 about 4 mils high and 1 cm in diameter as shown in FIG. 12A.

Figure 12B:
Figure 12C:
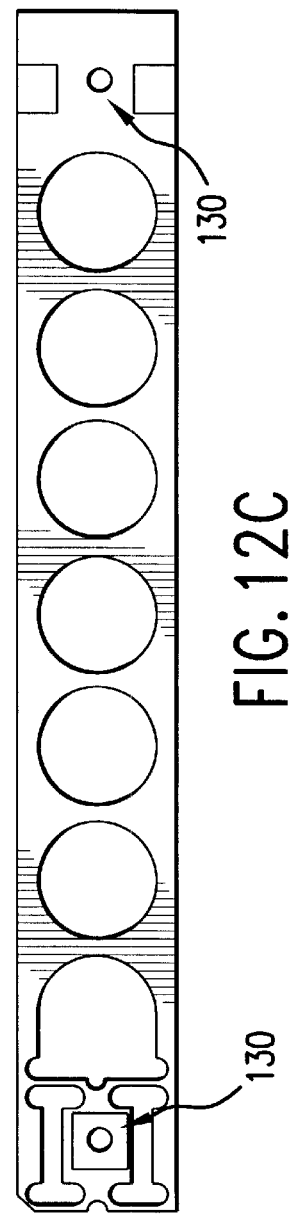

The mount is screwed securely to the bottom of the LNP enclosure using threaded holes 130 shown in FIG. 12C. The H-Flex joint permits thermal expansion and contraction of the enclosure bottom without transmittal of any significant stress to the grating. The joint provides very little resistance to small forces in the long direction of the grating. The expansion co-efficient is about 0.001 inch per pound, in this long direction, but is extremely strong and resistant to forces in any other direction.

Two H-Flex Joints

A third embodiment can be described by reference to FIGS. 13A, B, C, D, E and F. FIG. 13A is a top view, FIG. 13B is a side view and FIG. 13C is a bottom view. This mount is similar to the one described above and shown in FIG. 12A. However, this mount has two H-Flex joints 134 and 133 as shown enlarged in FIGS. 13D and 13E respectively. The mount is made of aluminum as is the LNP enclosure. The mount is mounted to the enclosure as described in the previous embodiment. The grating is attached to the mount with three short epoxy pillars as described above at the positions 132A, 132B and 132C as shown in FIGS. 13A, 13D and 13E. The surface of the mount at the epoxy positions (in this as well as the other embodiments) is preferably abraded with #40 grit dry blast alumina to produce a good epoxy surface. The legs of H-Flex 134 and H-Flex 133 are about 0.030 inch wide. Flex 133 permits expansion of the mount relative to the grating in the long direction of the grating and Flex 134 permits expansion in a short direction of the grating as indicated by the drawings. The second H-Flex joint permits the use of aluminum as the mount material which is less expensive and easier to machine than invar. Preferably, a four mill shim is used in this and the other embodiments when attaching the grating to the mount to assure that the epoxy pillar is the correct thickness (i.e., height).

Matching Thermal Co-efficient of Expansion

The reader should note that preferred designs of grating mounts should take into consideration the material used for the mount. For example, in the FIGS. 11A–D and in FIGS. 12A–C examples, invar is used for the mount which as a thermal co-efficient of thermal expansion similar to the thick ULE glass grating substrate. Therefore, the grating is attached with the three short epoxy pillars at two far apart locations to the long part of the mount with no attachment to the short part of the mount. In these two examples, one end of the long portion of the mount is attached to the chamber and the short portion of the mount at the other end of the mount is separately attached to the chamber. The flexure joint in both examples permit the mount and the chamber (having significantly different coefficients of expansion) to expand and contract at different rates.

In the FIG. 13A–E examples, the long portion of the mount is securely attached at two locations to the housing. This produces no significant stresses since both the mount and the housing are aluminum. The grating substrate which has a co-efficient of expansion substantially different from aluminum is attached to each of the three separate parts of the mount which by reason of the two flexure joints are free to move relative to each other. Thus, if in the FIGS. 11A–D and FIGS. 12A–C examples the mount were made of aluminum then in each case the long part of the mount only should be attached to the chamber floor and the grating should be attached to both parts. Also if in FIGS. 13A–E example, invar were used for the mount, the grating should be attached to the long solid part and the mount should be attached to the chamber at points 132A, 132B and 132C.

Hot Nitrogen Layer

Figure 3:
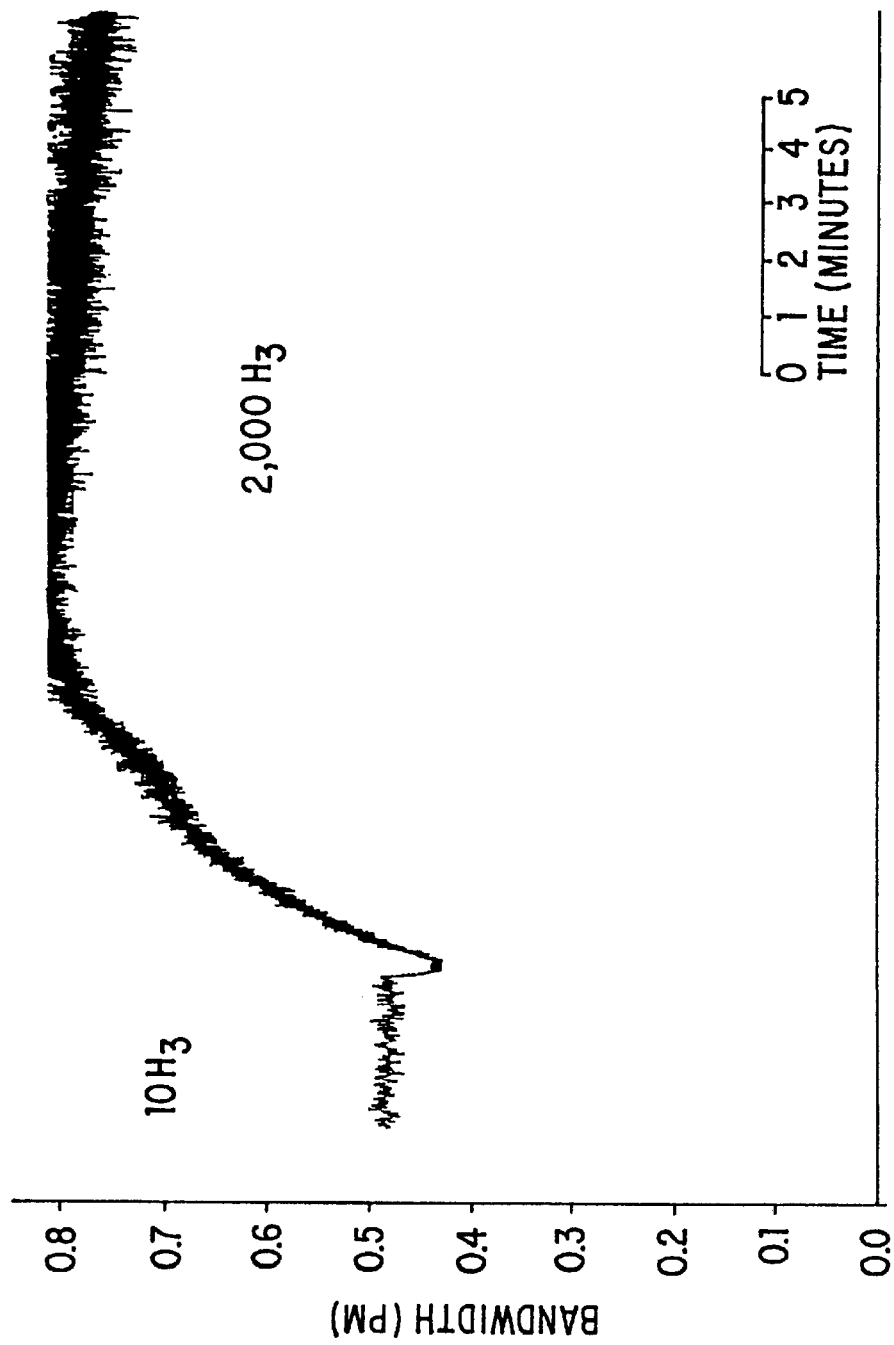
FIG. 3 shows adverse effects on bandwidth of a hot gas layer on the face of a line narrowing grating.

Applicants have determined that the poor performance at higher repetition rates as shown in FIG. 3 is partly the result of the development of a hot layer of nitrogen which builds up over a period of about 5 minutes on the face of the grating 48.

Figure 9:
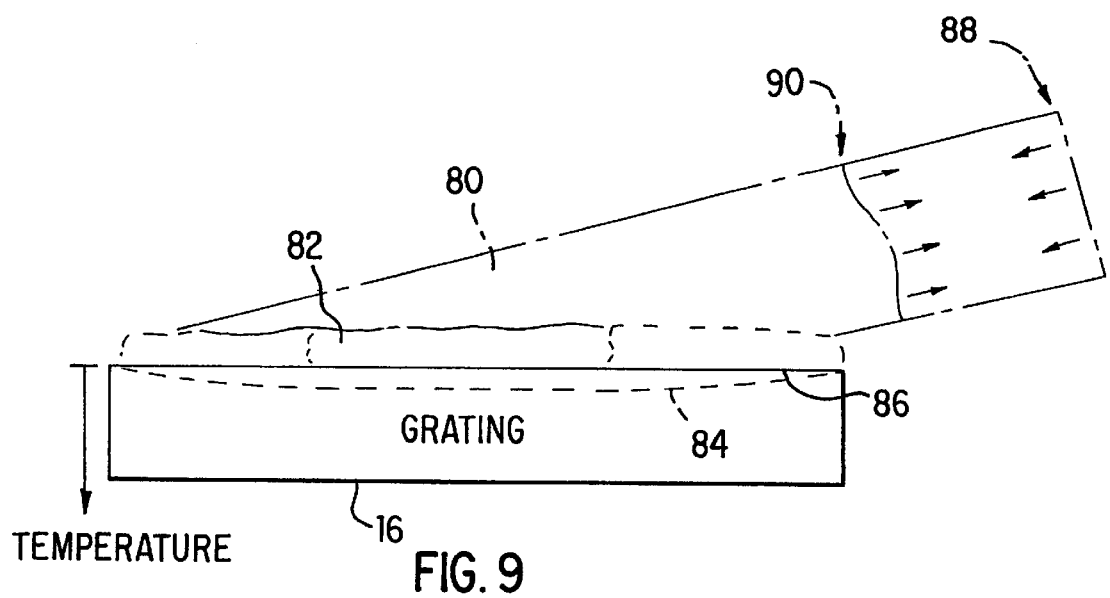
FIG. 9 shows the heating of the gas layer on the grating surface.

This hot gas is heated by the grating surface, which in turn is heated by absorbing a portion of incident laser beam. Typically, as much as 15 to 20% of incident light might be absorbed by grating surface. The surface temperature of the grating might arise 10 to 15° C. This temperature increase is non-uniform, it is higher in the middle of the grating and lower at the ends as shown in FIG. 9. Therefore, the air in front of the middle portion of the grating is hotter than the air in front of the edges. Therefore, when the laser beam 80 incidents on the grating surface 86 it goes through this boundary layer 82. Because this air has the same pressure, the hotter the air, the less its density is. So, the air near the center of the grating is less dense, than the air near the edges. Because of that, the laser beam 80 will have different phase shifts when it goes to the middle portion of the grating and edges. So, the incoming beam with parallel wavefront 88 will have a curved wavefront 90, corresponding to divergent beam. This happens even if grating 16 is perfectly flat.

Applicants have developed preferred modifications to the line narrowing unit to substantially eliminate this hot nitrogen layer.

Flow Across Grating Face

Figure 4A:
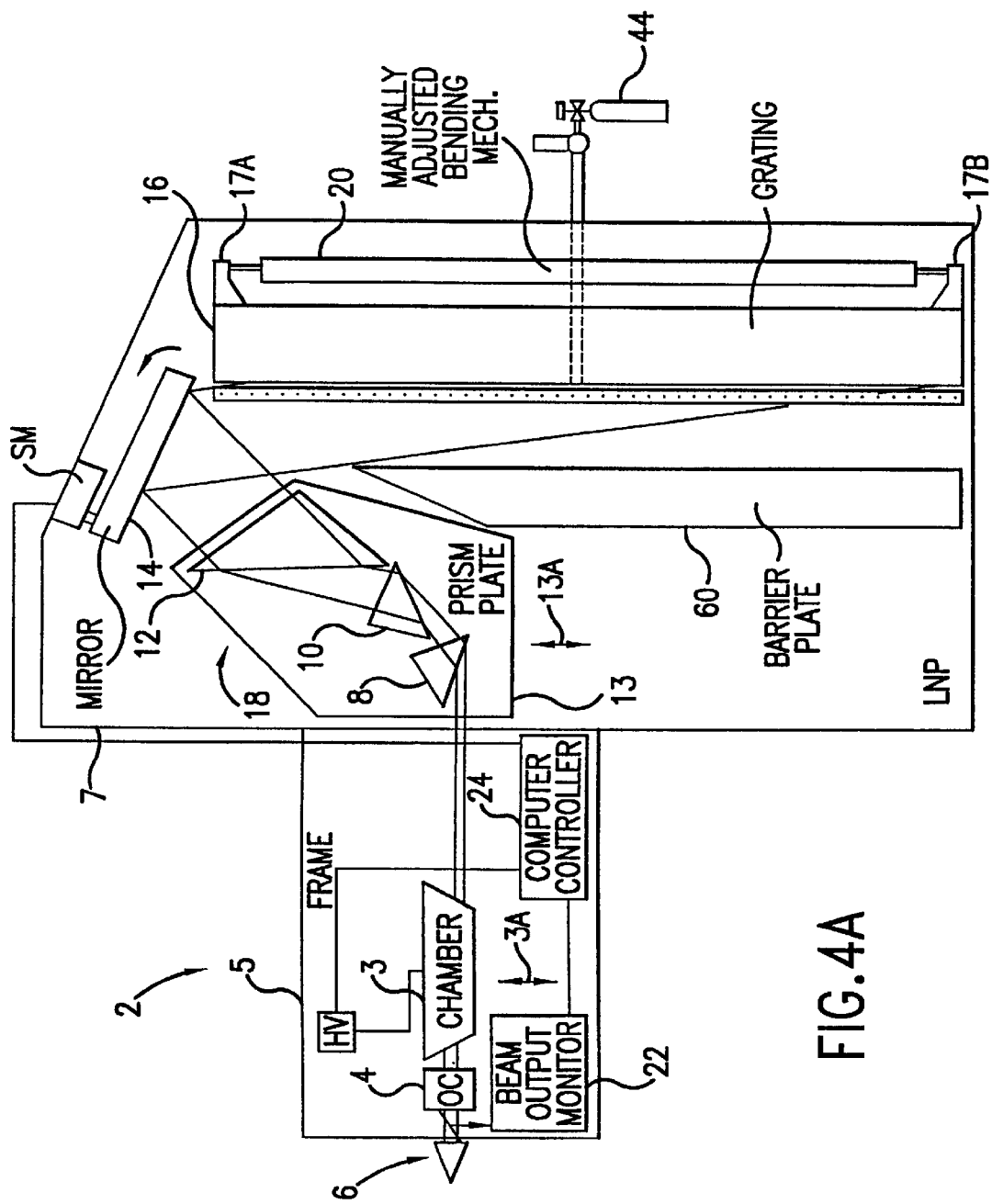
FIGS. 4A and 4B show a preferred embodiment of the present invention.
Figure 4B:
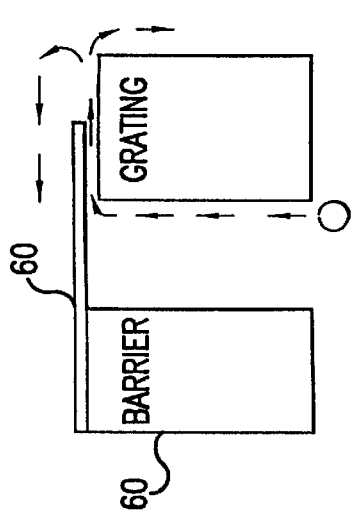
Figure 5A:
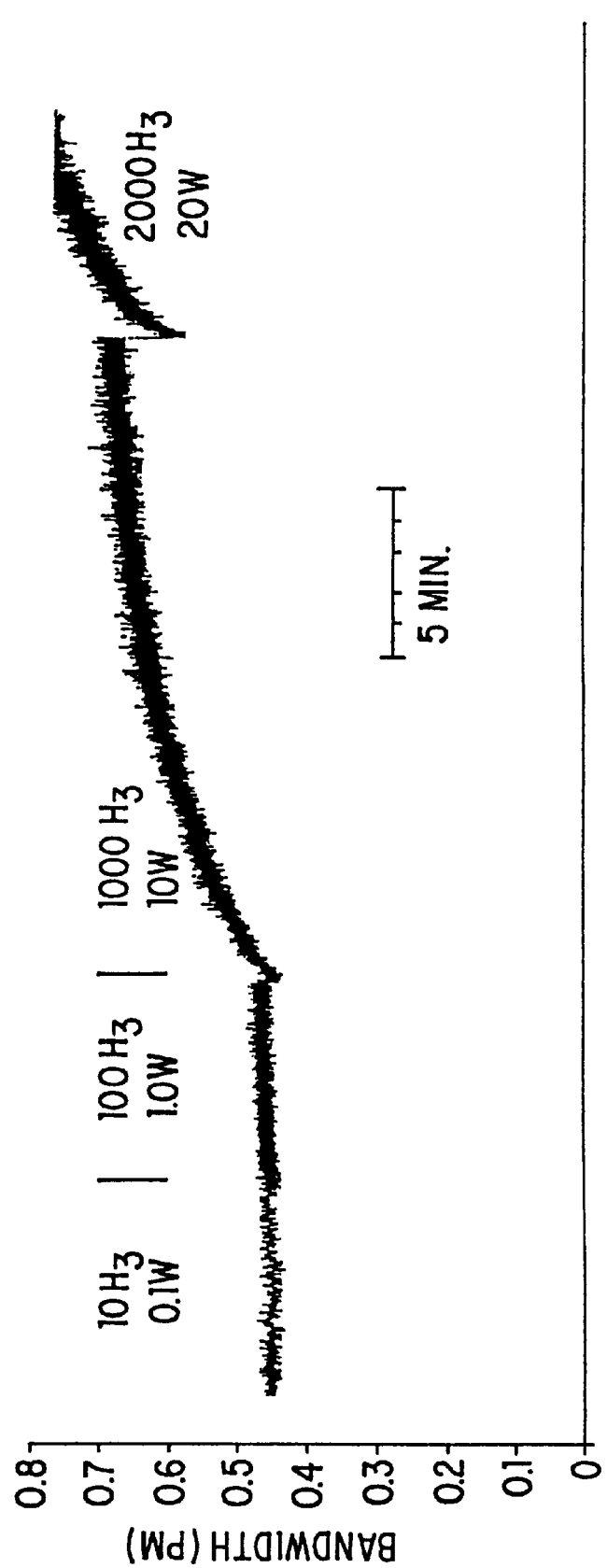
FIG. 5A shows bandwidth traces at various rep rates with prior art purging.
Figure 5B:
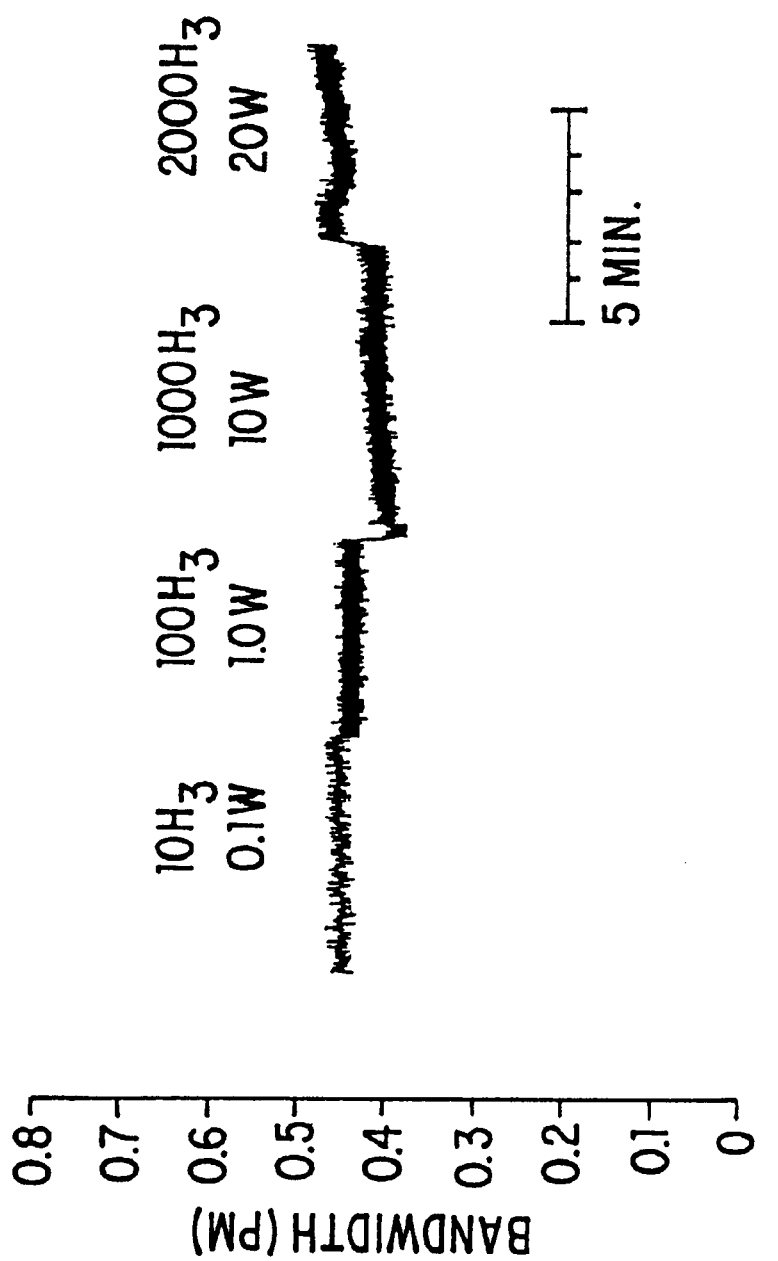
FIG. 5B shows bandwidth traces at various rep rates with purging in accordance with the present invention.

A first preferred embodiment of the present invention is shown in FIGS. 4A and 4B. In this case the nitrogen purge of about 2 liters per minute is flowed upward through approximately 1 mm diameter holes spaced at ½ inch in a 10 inch long ⅜ inch ID tube functioning as a purge gas manifold. Barrier plate 60 and barrier cover 62 force most of the nitrogen purge flow in the direction shown by the arrows in FIG. 4B. This arrangement has produced excellent results as shown by the chart in FIG. 5. In this case, an increase in the output average power from 0.1 W to 20 W resulted in variations within 0.4 to 0.5 pm. It is interesting to note that at 10 W average power, the bandwidth is actually slightly smaller than at 0.1 W.

It is important that the purge flow across the face of the grating be carefully controlled to avoid flow related distortions. Applicants have tested various flow rates and have determined that excessive flow can do more harm than good. For example, a flow rate of 20 liters per minute produced very poor results. Recommended flow rates are in the range of about 0.5 liters per minute to about 10 liters per minute.

It is also important to note, that this purge does not substantially reduce the temperature of the grating. The grating remains hot. What the purge does is to rather continuously displace air in front of the grating, so it does not have time to heat up by the grating. Very small flow rate and, correspondingly, gas velocity prevents any air distortions caused by the flow itself from affecting laser operation.

Other Purge Arrangements

Figure 6C:
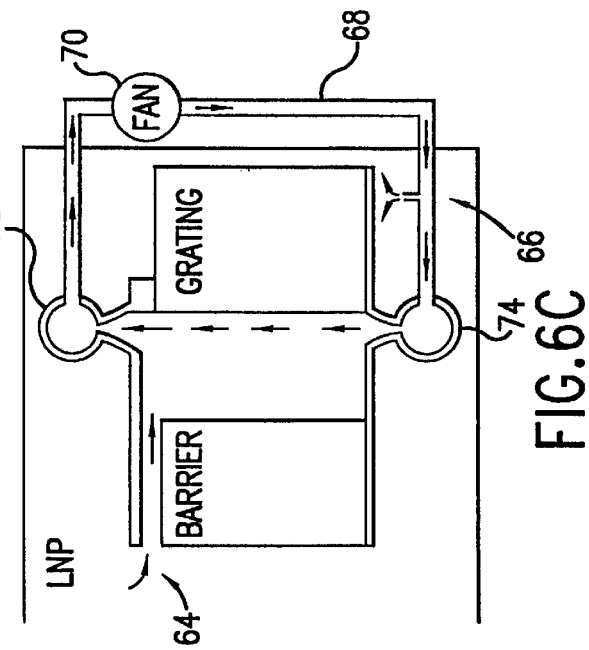
FIGS. 6A, 6B and 6C show alternate embodiments of the present invention.
Figure 6A:
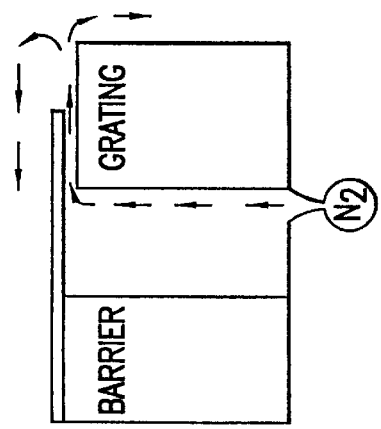
Figure 6B:
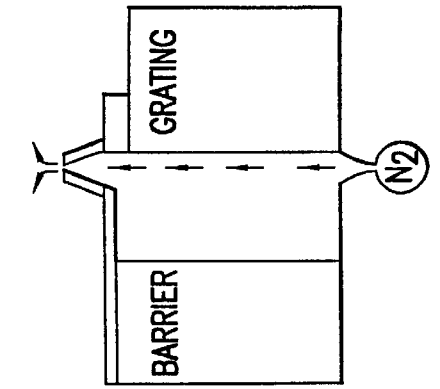

There are many potential arrangements to provide gas flow across the face of the grating to prevent the buildup of the thermal layer which causes the problem shown in FIG. 3. For example, a narrow slit of about 0.5 mm running the length of the manifold could be used instead of the small holes. Also smoother flow could be provided with a slit type nozzle such as shown in cross section in FIG. 6A or slit nozzles could be provided both at the top and bottom of the grating as shown in FIG. 6B. Also, flow across the grating face could be provided with a very small fan in a semi-closed system as shown in FIG. 6C. In this case, the regular nitrogen purge could be provided as in the prior art as shown in FIG. 2. In the FIG. 6C embodiment, the cavity between the grating and the barrier is not sealed and purge gas in permitted to circulate into and out of the cavity as shown at 64 and 66. The tubes 68 leading to and from fan 70 connect near the center of slitted tubes 72 and 74 which is just above and below the hottest area on grating 16.

Reduced Gas Pressure

A second solution to the hot gas layers problem is to reduce the gas pressure in the line narrowing package.

Gas convection modulates the gas density spatially, causing an inhomogeneous distribution of the refractive index, which in turn leads to phase front aberration. The magnitude of any aberration caused by gas density fluctuations, which are due to the gas convection close to the heated grating surface, is approximately linearly dependent on the nominal value of the susceptibility or the refractive index and thus the gas density.

Convective cooling of the surface of the grating and other optical components is not substantially reduced so long as the mean free path of the gas molecules is not less than distances between the "hot" and "cold" surfaces in the LNP. If we assume these distances are about 10 cm then as a rule of thumb we would say that the gas pressure should not be reduced beyond the pressure where the mean free path length is about 10 cm. That pressure is in the range of about 1 to 10 millibar so that the density of the gas in the LNP is about 0.1 to 1.0 percent the density at atmospheric conditions.

Figure 10:
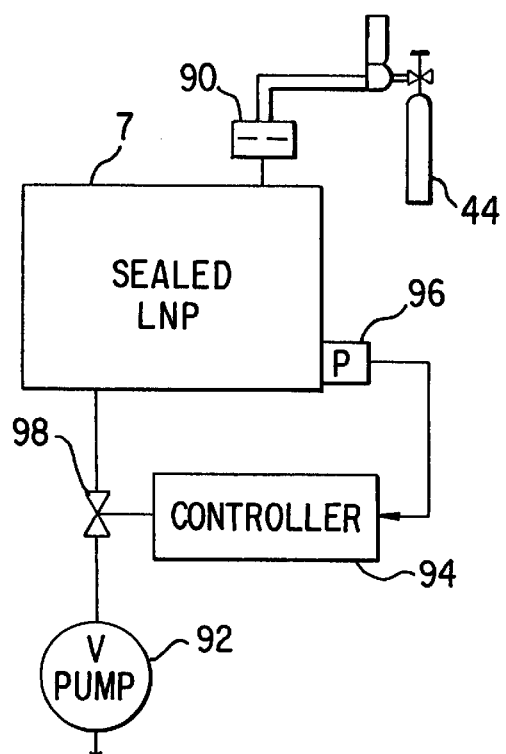
FIG. 10 shows a technique for reducing the purge gas pressure.

FIG. 10 is a sketch showing a system for maintaining a controlled pressure in the LNP at about 1 to 10 millibar. The nitrogen enters sealed LNP 7 through orifice 90. Vacuum pump 92 is used to create the vacuum in the LNP and the desired vacuum is maintained by controller 94 using a feedback signal from pressure sensor 96 to control needle valve 98. Since LNP is a sealed system and the pressure is approximately at equilibrium, sensor 96 may be thermocoupled.

Purge With Helium

Another solution to reduce the hot layer effect is to purge the LNP with helium. Helium has a smaller differential refractive index so that a hot layer will cause less distortion. In addition, helium has much better heat transfer properties than nitrogen. Argon may also be used with the same advantages. Helium, however, is much more expensive than nitrogen.

Figure 7:
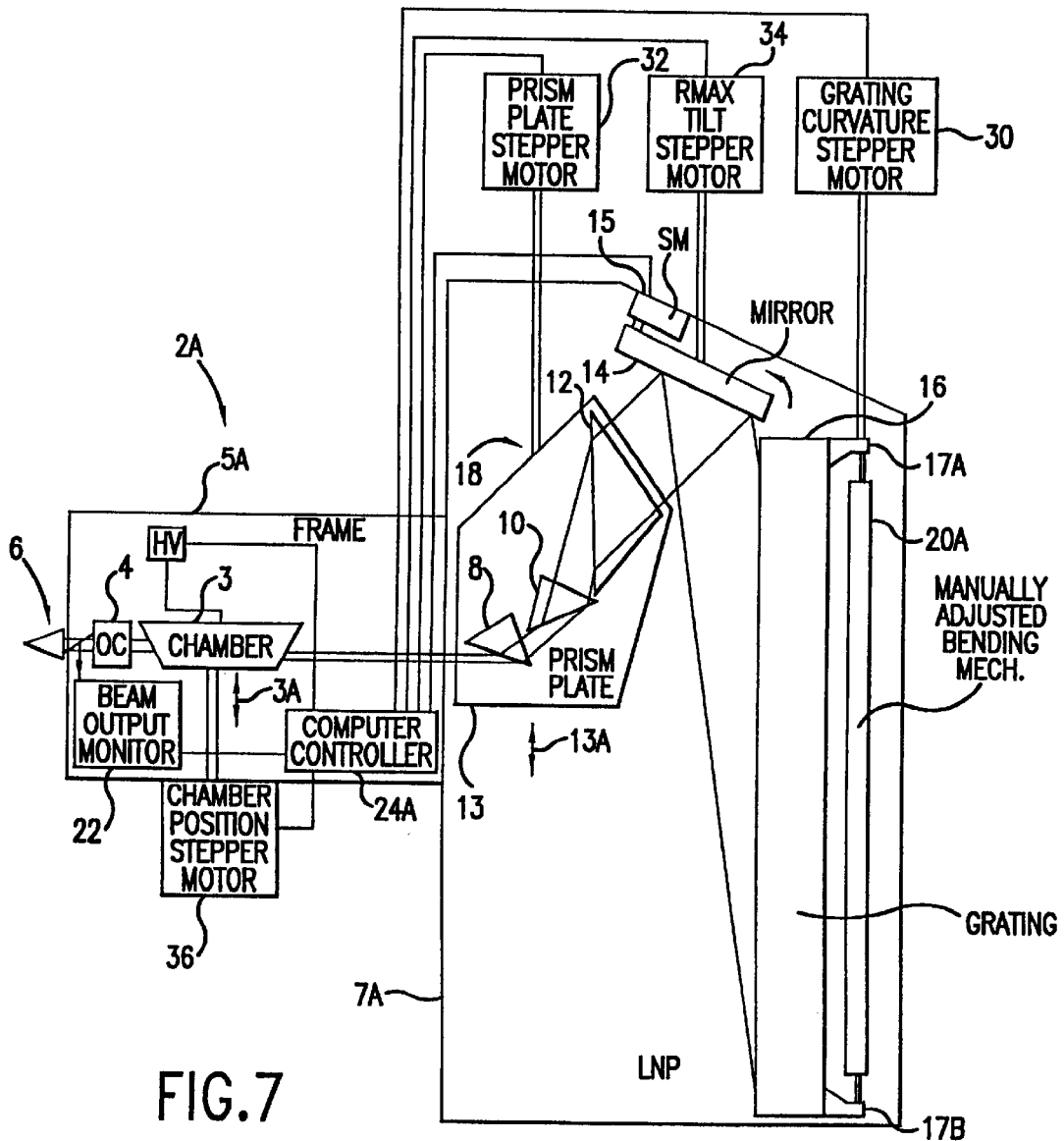
FIGS. 7 and 8 show a LNP equipped for fast feedback control.
Figure 8:
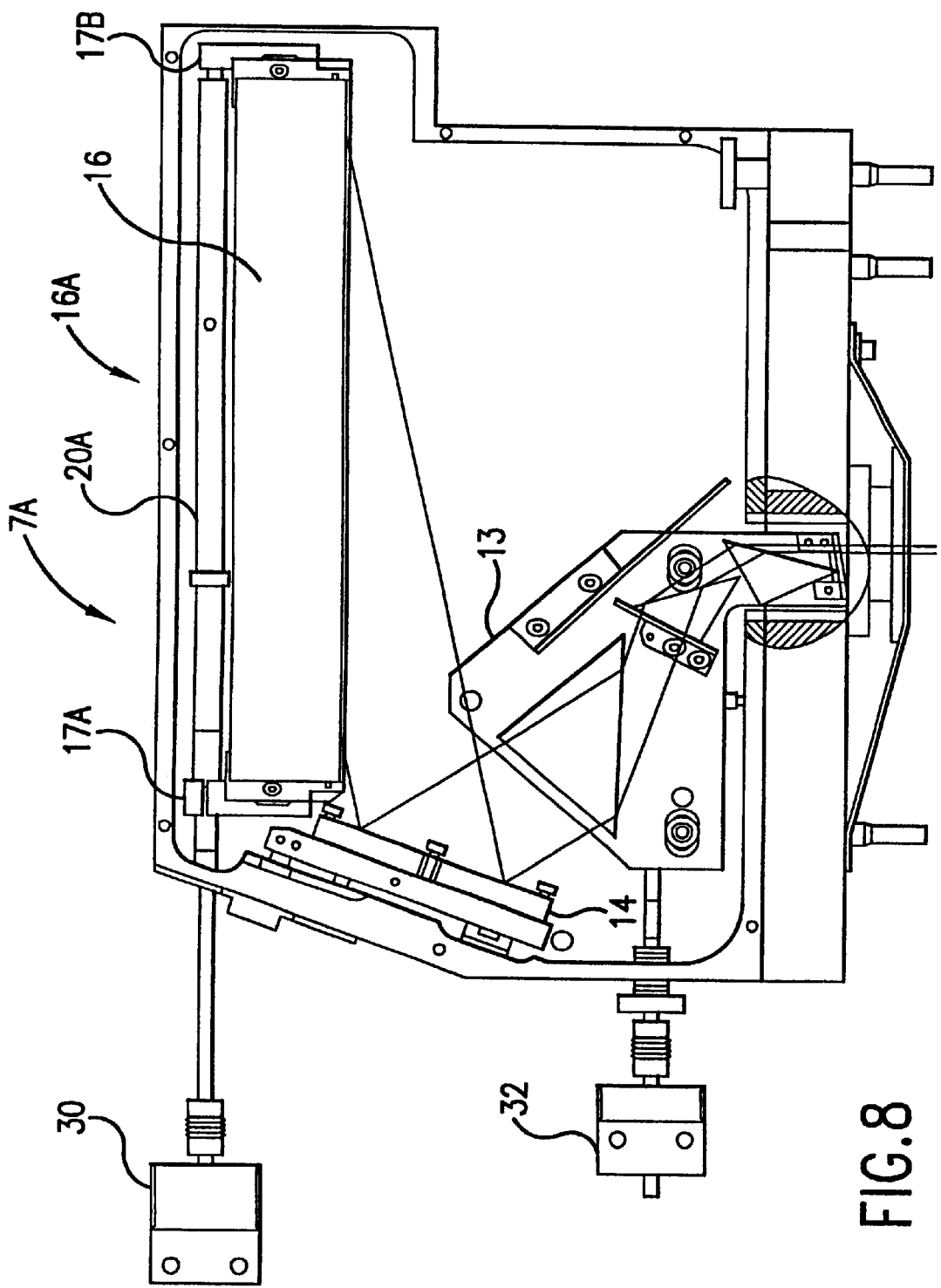

Persons skilled in the art will recognize that in addition to the above-described specific embodiments of the present invention, there are many other embodiments possible to deal with distortions. For example, materials other than invar or aluminum can be used for the mount, but for reasons explained above the material should have a co-efficient of thermal expansion matching either the rigid grating substrate or the chamber housing. Another technique for dealing with the hot gas layer is to provide active bandwidth control to correct for the adverse effects of the hot gas layer. Techniques for substantially real time control of several wavelength parameters are described in a U.S. patent application filed Sep. 3, 1999, Ser. No. 09/390,579 which is incorporated by reference herein. These techniques include fast feedback control of the position of the beam expanding prisms, grating curvature and tuning mirror position. Control of the position of the laser chamber is also provided. FIG. 7 is a combination block diagram schematic drawing of the entire laser system and FIG. 8 is a drawing of the LNP with the added feedback control features. In this embodiment, the curvature of the grating is controlled by grating curvature stepper motor 30 to compensate for the distortion caused by the hot gas layer on the face of the grating. Therefore, the scope of the present invention should be determined by the appended claims and their legal equivalents.

We claim:

1. A grating based line narrowing device for line narrowing a laser producing high energy laser beams, said device comprising:
   (A) a grating having a grooved surface layer or layers fixed on a rigid grating substrate, said grating defining a long direction,
   (B) a chamber for housing at least said grating,
   (C) a purge means for providing a purge gas for purging said chamber,
   (D) a beam expanding means for expanding a beam from said laser to produce an expanded beam,
   (E) a tuning means for directing said expanded beam onto the grating face in order to select from said expanded beam a desired range of wavelengths, and
   (F) a flexural grating mount comprising:
      (1) a first part and a second part, said first part and said second part each being securely attached to said chamber, and said grating being securely attached to said first part only;
      (2) a flexure joint connecting said first part to said second part so as to permit said second part to move relatively easily in said long direction relative to said first part.

2. A device as in claim 1 wherein said flexure joint is an H-Flex joint.

3. A device as in claim 1 wherein said flexure joint is a dovetail sliding joint.

4. A device as in claim 1 wherein said mount is comprised of a material having a co-efficient of thermal expansion closely matched to said rigid grating substrate.

5. A device as in claim 1 wherein said heat removal means comprises a purge gas manifold having a plurality of small ports for directing purge gas across the grating face.

6. A device as in claim 2 wherein said heat removal means comprises a grating purge gas flow control means for controlling purge gas flow across the grating face.

7. A device as in claim 3 wherein said purge gas flow control means comprises structures defining a flow path across said grating face and then away from said grating face.

8. A grating based line narrowing device for line narrowing a laser producing high energy laser beams, said device comprising:

(A) a grating having a grooved surface layer or layers fixed on a rigid grating substrate, said grating defining a long direction, (B) a chamber for housing at least said grating, (C) a purge means for providing a purge gas for purging said chamber, (D) a beam expanding means for expanding a beam from said laser to produce an expanded beam, (E) a tuning means for directing said expanded beam onto the grating face in order to select from said expanded beam a desired range of wavelengths, and (F) a flexural grating mount comprising:

(1) a first part and a second part, said first part and said second part each being securely attached to said rigid grating substrate, and said chamber being securely attached to said first part only;

(2) a flexure joint connecting said first part to said second part so as to permit said second part to move relatively easily in said long direction relative to said first part.

9. A device as in claim 8 wherein said flexure joint is an H-Flex joint.

10. A device as in claim 8 wherein said flexure joint is a dovetail sliding joint.

11. A device as in claim 8 wherein said mount is comprised of a material having a co-efficient of thermal expansion closely matched to said rigid grating substrate.

12. A device as in claim 8 and further comprising a heat removal means for removing heat from a hot purge gas layer adjacent to said grooved surface layer.

13. A device as in claim 12 wherein said heat removal means comprises a purge gas manifold having a plurality of small ports for directing purge gas across the grating face.

14. A device as in claim 12 wherein said heat removal means comprises a grating purge gas flow control means for controlling purge gas flow across the grating face.

15. A device as in claim 14 wherein said purge gas flow control means comprises structures defining a flow path across said grating face and then away from said grating face.

16. A device as in claim 1 wherein said mount further comprises a second flexure joint.

17. A device as in claim 8 wherein said mount further comprises a second flexure joint.

\* \* \* \* \*